United States Patent
Auracher

(10) Patent No.: US 6,400,739 B1
(45) Date of Patent: Jun. 4, 2002

(54) WAVELENGTH-STABILIZED LASER CONFIGURATION

(75) Inventor: Franz Auracher, Baierbrunn (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/338,474

(22) Filed: Jun. 22, 1999

(30) Foreign Application Priority Data

Jun. 22, 1998 (DE) ......................................... 198 27 699

(51) Int. Cl.[7] ................................................ H01S 3/13
(52) U.S. Cl. ............................................ 372/32; 372/34
(58) Field of Search ............................... 372/32, 43, 34

(56) References Cited

U.S. PATENT DOCUMENTS

| | | | | |
|---|---|---|---|---|
| 3,738,245 A | * | 6/1973 | Theer | 95/42 |
| 3,962,576 A | * | 6/1976 | Kuhl | 250/201 |
| 4,583,228 A | | 4/1986 | Brown et al. | |
| 4,756,592 A | * | 7/1988 | Sasayama | 350/96.2 |
| 5,007,065 A | * | 4/1991 | Trunta | 372/94 |
| 5,287,367 A | * | 2/1994 | Yanagawa | 372/31 |
| 5,305,334 A | * | 4/1994 | Maragalit | 372/32 |

FOREIGN PATENT DOCUMENTS

DE  19704502 C1  2/1998

OTHER PUBLICATIONS

Published International Application No. 95/29521 (Chaney), dated Nov. 2, 1995.

* cited by examiner

*Primary Examiner*—Paul Ip
*Assistant Examiner*—Gioacchino Inzirillo
(74) *Attorney, Agent, or Firm*—Laurence A. Greenberg; Werner H. Stemer; Ralph E. Locher

(57) ABSTRACT

A wavelength-stabilized laser configuration has a semiconductor laser and a wavelength regulating device. The regulating device contains an optical isolator, an optical filter, two detectors and a signal processing device. According to the invention, partial beams required for the detectors are coupled out by polarization filters that are contained in the optical isolator and are simultaneously used as beam splitters.

22 Claims, 6 Drawing Sheets

WAVELENGTH-STABILIZED LASER CONFIGURATION

BACKGROUND OF THE INVENTION

FIELD OF THE INVENTION

The invention relates to a wavelength-stabilized laser configuration containing a semiconductor laser and a regulating device for regulating a laser beam.

It is already known to use laser modules based on a semiconductor laser in optical transmissions systems, which laser modules are operated using a wavelength division multiplex (WDM) method in order to maintain a high transmission capacity. In order to be able to transmit as many channels as possible, the laser modules have to meet high requirements with regard to their wavelength's stability.

Furthermore, it is already known to equip high-rate laser modules of this type with an optical isolator. The optical isolator has the function of suppressing undesirable perturbations of the semiconductor laser due to reflected laser light.

A wavelength-stabilized laser configuration is described in Published, Non-Prosecuted German Patent Application DE 197 12 845.9 A, which was not published before the priority date. For the purpose of wavelength stabilization, two partial beams are coupled out of the laser light pencil and detected by respective detectors. Beam splitters or mirrors are used for coupling out the partial beams. At least one of the partial beams passes through an optical filter with wavelength-dependent transmission, with the result that the corresponding detected signal is wavelength-dependent. By comparing the wavelength-dependent signal with the wavelength-independent signal of the other detector, the instantaneous wavelength of the semiconductor laser is determined and a deviation with respect to a predetermined desired value is determined. The laser wavelength is then set to the desired wavelength by temperature regulations of the semiconductor laser.

SUMMARY OF THE INVENTION

It is accordingly an object of the Invention to provide a wavelength-stabilized laser configuration which overcomes the above-mentioned disadvantages of the prior art devices of this general type, in which a simple and cost-effective structure of a laser configuration with a semiconductor laser is provided, and the laser configuration is suitable for high transmission capacities and, in particular, for wavelength division multiplexing.

With the foregoing and other objects in view there is provided, in accordance with the invention, a wavelength-stabilized laser configuration, containing:

- a semiconductor laser outputting a laser beam having a laser power, a laser beam path, and a laser light;
- a regulating device, including:
  - a first optical detector receiving a first partial beam derived from the laser beam and outputting a first optical detector output signal;
  - an optical filter;
  - a second optical detector disposed downstream of the optical filter and receiving a second partial beam derived from the laser beam and filtered by the optical filter, the second optical detector outputting a second optical detector output signal;
  - a signal processing device receiving the first optical detector output signal and the second optical detector output signal and determining from the first optical detector output signal and the second optical detector output signal an actual value signal being representative of an instantaneous laser wavelength $\lambda$ being independent of the laser power;
  - a comparison device connected to the signal processing device for comparing the actual value signal with a predetermined desired value signal specifying a desired wavelength $\lambda_c$; and
  - a drive device connected to the comparison device, the drive device generating a control signal setting an operating parameter of the semiconductor laser, the operating parameter influencing a wavelength to be stabilized such that the actual value signal substantially corresponds to the predetermined desired value signal; and
- an optical isolator disposed in the laser beam path and having a first polarizer, a device for rotating a plane of polarization of the laser light and connected downstream of the first polarizer, and a second polarizer connected downstream of the device for rotating the plane of polarization of the laser light, at least one of the first polarizer and the second polarizer being used as a beam splitter for coupling out one of the first partial beam and the second partial beam.

The laser configuration according to the invention has both wavelength stabilization and an optical isolator and, therefore, is especially suitable for the transmission of high data rates in WDM operations. According to the invention, at least one of the partial beams required for the wavelength stabilization is in this case coupled out by a polarizer of the optical isolator. The polarizer thus fulfills two functions at the same time, namely that of a polarizer in the optical isolator and that of a beam splitter in the wavelength stabilization circuit. As a result, a beam splitter as an additional component is obviated and a simple and compact overall structure is obtained.

It is preferable for (at least) the second polarizer to be used as a beam splitter and to be used for coupling out the second partial beam. The fact that the optical isolator suppresses reflections from the filter and from the second detector and, consequently, prevents these from having a perturbing effect on the semiconductor laser has a favorable effect in this case.

Furthermore, it is expedient for the first polarizer (also) to be used as a beam splitter for coupling out the first partial beam. In this way, the integration level and the compactness of the configuration according to the invention are further promoted by the obviation of a further beam splitter.

A preferred refinement of the invention is characterized in that the filter is a cut-off filter or a bandpass filter. If a bandpass filter is used, it is operated at one of the cut-off wavelengths of the bandpass filter.

A further preferred refinement of the invention is characterized in that use is made of a further filter for filtering the first partial beam that is guided to the first detector. In this case, it is advantageous that both filters are operated with linearly polarized light. This reduces the requirements to be made of the filters and makes it possible to use cost-effective filters.

If two filters are used, it is preferred to arrange a $\lambda/2$ plate with suitable orientation of its optical axis in the beam path of the first partial beam between the first polarizer and the further filter. The $\lambda/2$ plate serves to suppress reflections occurring at the further filter (so-called "quasi-isolator").

It is preferable for the further filter to have a filter curve that is shifted relative to the filter curve of the filter and in the opposite direction with regard to the desired wavelength $\lambda_c$. By evaluating the detector signals in a suitable manner, it is possible in this case to obtain a wavelength sensitivity which, given the same filter gradient is twice as high as that obtained when just one filter is used.

If two filters are used, it is furthermore advantageous if the filter curve of the filter and the filter curve of the further filter have a point of intersection at the desired wavelength $\lambda_0$. In this case, the wavelength of the semiconductor laser can be adjusted by zero regulation to the desired wavelength $\lambda_0$.

A further preferred refinement of the invention is characterized in that the filter and/or the further filter are configuration in a manner that allows them or it to pivot. The pivotable configuration of the filter makes it possible to vary and adjust the center wavelength $\lambda_M$ of the filter by tilting the filter relative to the axis of the incident partial beam. Therefore, a whole range of different desired wavelengths can be covered with the same filter, as a result of which changing conditions of use can also be controlled without the need for exchanging the filter. Furthermore, a simple possibility of adjustment is afforded, which allows the tolerance requirements that are to be made of the filter to be reduced with regard to adhering to the center wavelength $\lambda_M$.

Instead of the filters, the second polarizer and/or the first polarizer may also be disposed in a manner allowing them or it to pivot, as a result of which the same effect is obtained.

A particularly compact configuration is achieved if the second polarizer and the filter are disposed in a mutually positionally fixed relationship in a common, pivotable unit.

The device for rotating the plane of polarization is advantageously configured as a Faraday rotator. In this case, a preferred refinement of the invention is characterized in that the Faraday rotator itself is permanently magnetized. Faraday rotators of this type need not be equipped with an external permanent magnet, which can impede, or make more difficult, the lateral coupling out of the partial beam or partial beams to be coupled out via the polarizer or polarizers.

On account of its compactness and versatility, the wavelength-stabilized laser configuration according to the invention is particularly suitable for constructing high-rate laser modules having small structural sizes. Such a laser module contains, in addition to the wavelength-stabilized laser configuration, a hermetically sealed module housing accommodating the semiconductor laser, the optical isolator and at least the optical detectors and the optical filter of the regulating device. A laser module of this type has the advantage of an internal wavelength reference in conjunction with a compact and cost-effective mode of construction. It is advantageous, moreover, that, in the case of such a module, the requirements made of the filter are reduced further since the filter is exposed to no moisture at all and a constant operating temperature of the filter can also be brought about in a simple manner by coupling to a cooling device which cools the semiconductor laser.

Other features which are considered as characteristic for the invention are set forth in the appended claims.

Although the invention is illustrated and described herein as embodied in a wavelength-stabilized laser configuration, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 7b is a side-elevational view of the fourth embodiment variant illustrated in FIG. 7a from the direction of the arrow X shown in FIG. 7a.

DESCRIPTION OF THE PREFERRED EMBODIMENTS

Figure 1:
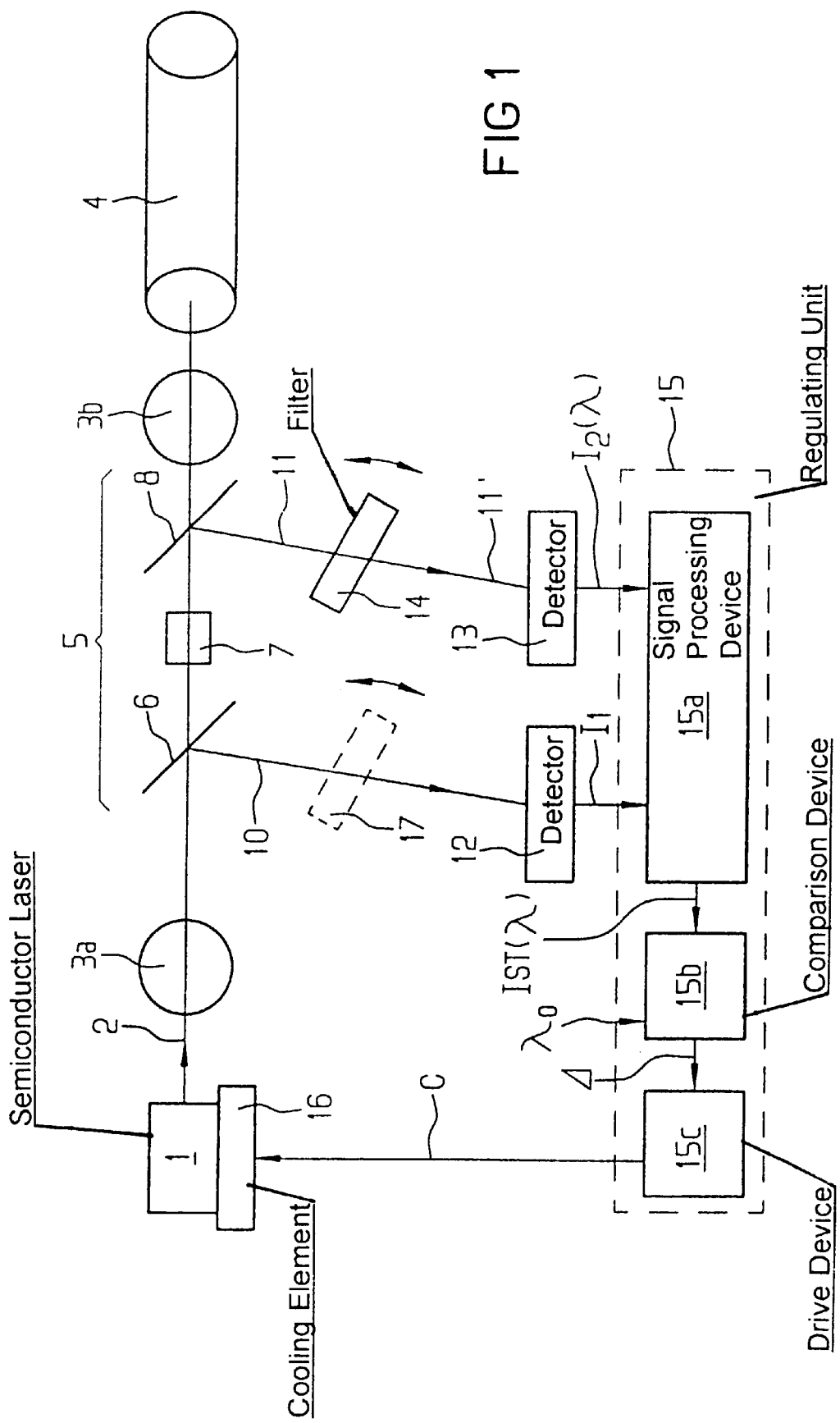
FIG. 1 is a diagrammatic, block diagram of one exemplary embodiment of the Invention.

In all the figures of the drawing, sub-features and integral parts that correspond to one another bear the same reference symbol in each case. Referring now to the figures of the drawing in detail and first, particularly, to FIG. 1 thereof, there is shown one exemplary embodiment of the invention having a semiconductor laser 1, which emits a laser light pencil 2. The laser light pencil 2 is collimated by an optical unit, which may contain one or a plurality of lenses, or is focused onto an entry face of a glass fiber 4. In the last-mentioned case, the optical unit may contain, as illustrated here, two lenses (or groups of lenses) 3a, 3b, for example, the first lens 3a generating an approximately collimated laser light pencil, which is focused by the second lens 3b.

An optical isolator 5, which is constructed from a first polarizer 6, a Faraday rotator 7 and a second polarizer 8, is situated in the beam path downstream of the lens 3a.

Figure 2:
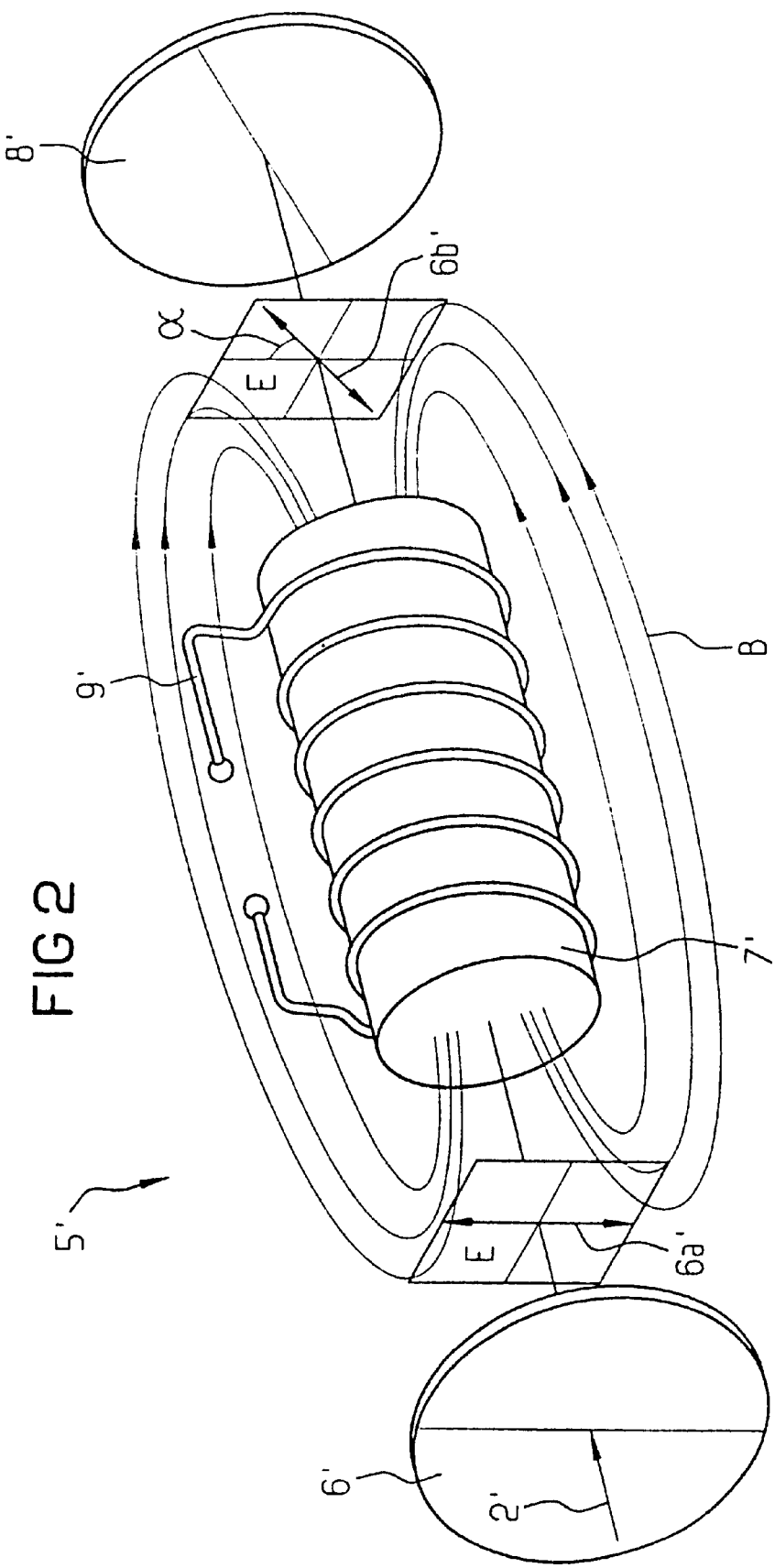
FIG. 2 is a perspective view for elucidating a structure and a method of operation of an optical isolator.

An optical isolator is known as such in the art and serves to suppress undesirable perturbations of the semiconductor laser 1 caused by reflected laser light. The fundamental structure and the method of operation of an optical isolator 5' is illustrated in more detail in FIG. 2. The optical isolator 5' has a first polarizer 6', a Faraday rotator 7' and a second polarizer 8'. The first polarizer 6' generates a linearly polarized laser light pencil 2' whose polarization direction is determined by a plane of polarization of the first polarizer 6' and is specified by a vector 6a' of an electric field strength E as shown in FIG. 2. Upon passing through the Faraday rotator 7', the vector 6a' of the electric field strength is rotated through a predetermined angle α of rotation (for example α=45°). The rotation of the plane of polarization, the rotation being based on the so-called Faraday effect, requires a magnetic field B, which is applied to the Faraday rotator 7' for example externally by a solenoid 9' or a permanent magnet. The reference symbol 6b' designates the vector of the electric field strength of the laser light pencil 2' after passing through the Faraday rotator 7'. The second polarizer 8' is set in such a way that its plane of polarization coincides with the vector 6b'. The laser light pencil 2' can thus pass unhindered through the second polarizer 8'.

Returning light reflections "see" an oppositely directed magnetic field B in the Faraday rotator 7'. The polarization direction, which is predetermined by the second polarizer 8', is therefore rotated with the opposite rotation sense with respect to a beam direction. The resultant polarization direction behind the Faraday rotator 7' is oriented perpendicularly to the vector 6a', Consequently, the reflection cannot pass through the polarizer 6', thereby precluding an undesirable perturbation of the semiconductor laser 1.

In the configuration according to the invention, at least one of the polarizers 6, 8 or, as illustrated in FIG. 1, preferably both polarizers 6, 8 are used for coupling first and second partial beams 10, 11 out of the laser light pencil 2. For this purpose, the normals to the polarizers 6, 8 are tilted relative to the beam axis of the laser light pencil 2.

The polarizers 6, 8 are thus used as beam splitters. A suitable coupling-out ratio for the intensities of the first and second partial beams 10, 11 can be set by providing the polarizers 6, 8 with a corresponding reflective or antireflection coating.

The first partial beam 10 falls directly onto a first detector 12 and is converted by the latter into a first electrical detector signal I1. The first detector signal I1 corresponds to an intensity of the first partial beam 10 and is thus proportional to an intensity of the laser light pencil 2.

The second partial beam 11 passes through an optical filter 14. The optical filter 14 may be a cut-off filter (high-pass or low-pass filter) or a bandpass filter operated at one of its cut-off wavelengths. In structural terms, the filter 14 may be embodied for example as a dielectric filter or as an etalon.

The filtered second partial beam 11' that has passed through the filter 14 impinges on a second detector 13. The second detector 13 generates a second electrical detector signal $I_2(\lambda)$. On the one hand, the second electrical detector signal $I_2(\lambda)$ is proportional to the intensity of the laser light pencil 2 and, on the other hand, it is dependent on the laser light wavelength $\lambda$ on account of the filter characteristic of the filter 14.

In order to avoid perturbations of the semiconductor laser 1 due to reflections at the detectors 12 and 13, the first and second partial beams 10, 11' are each tilted relative to the normals to the detectors. Tilting is expedient in the case of the first detector 12, in particular, since the reflection thereof is not eliminated by the optical isolator 5.

The two detector signals $I_1$ and $I_2$ ($\lambda$) are fed to an electronic regulating unit 15 containing a signal processing device 15a, a comparison device 15b and a drive device 15c.

The signal processing device 15a determines from the two detector signals $I_1$ and $I_2(\lambda)$ an actual value signal ACTUAL ($\lambda$), which is representative of the instantaneous laser light wavelength k and is independent of the intensity of the laser light pencil 2, that is to say of he power of the semiconductor laser 1.

The actual value signal ACTUAL($\lambda$) used may be, for example, a quotient of the second detector signal $I_2(\lambda)$ and the first detector signal $I_1$, that is to say ACTUAL($\lambda$)=$I_2(\lambda)$/$I_1$, since the power dependence of the two signals precisely cancels out in this case.

The comparison device 15b connected downstream of the signal processing device 15a compares ACTUAL($\lambda$) with a desired value signal DESIRED, which prescribes a desired wavelength $\lambda_0$. The comparison device 15b provides a signal $\Delta$ which is representative of the deviation between ACTUAL($\lambda$) and DESIRED. The desired wavelength $\lambda_0$ can in this case be prescribed in a variable manner externally.

The deviation signal $\Delta$ is fed to the drive device 15c. The drive device 15c thereupon generates a control signal C, which is conducted to a cooling element 16, for example a Peltier element. The cooling element 16 is in good thermal contact with the semiconductor laser 1. The laser light wavelength $\lambda$ is regulated by way of the temperature dependence of the laser light emission with regard to $\lambda$.

The comparison device 15b and the drive device 15c may be realized for example in the form of a PI or PID regulator or else as a digital regulator.

Figure 3:
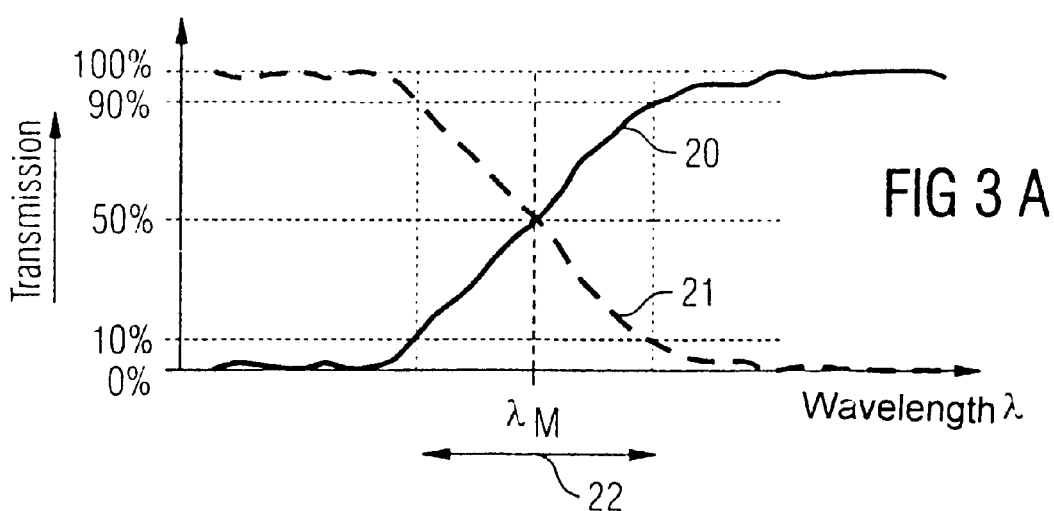
FIG. 3a is a graph showing a wavelength dependence of a transmission of an optical high-pass filter and of an optical low-pass filter.
FIG. 3b is a graph showing the wavelength dependence of the transmission of two optical bandpass filters.
FIG. 3c is a graph, with regard to FIG. 3a, showing a functional dependence of an actual value $(I_1-I_2)/(I_1+I_2)$ of the wavelength for the case where the two filters are a high-pass filter and a low-pass filter whose transmission curves intersect at the center wavelength $\lambda_M$.
Figure 3:
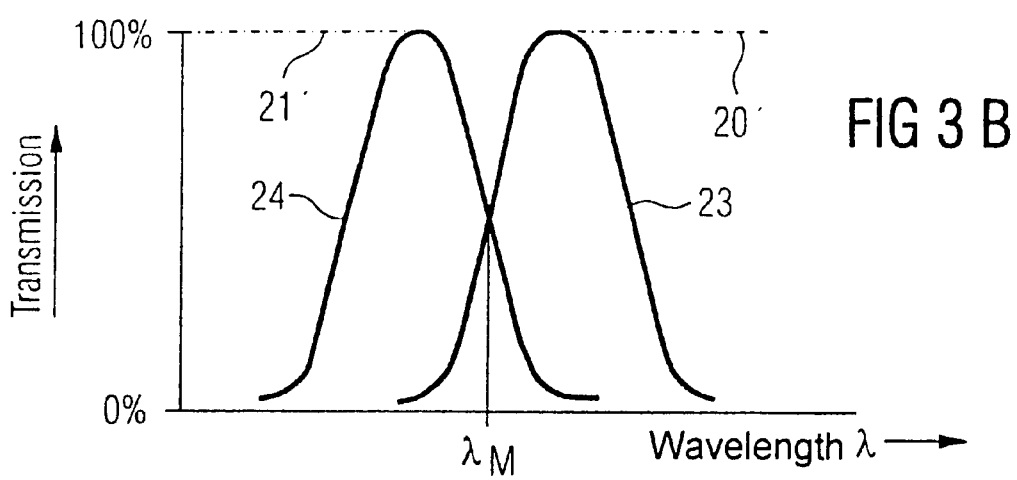
Figure 3:
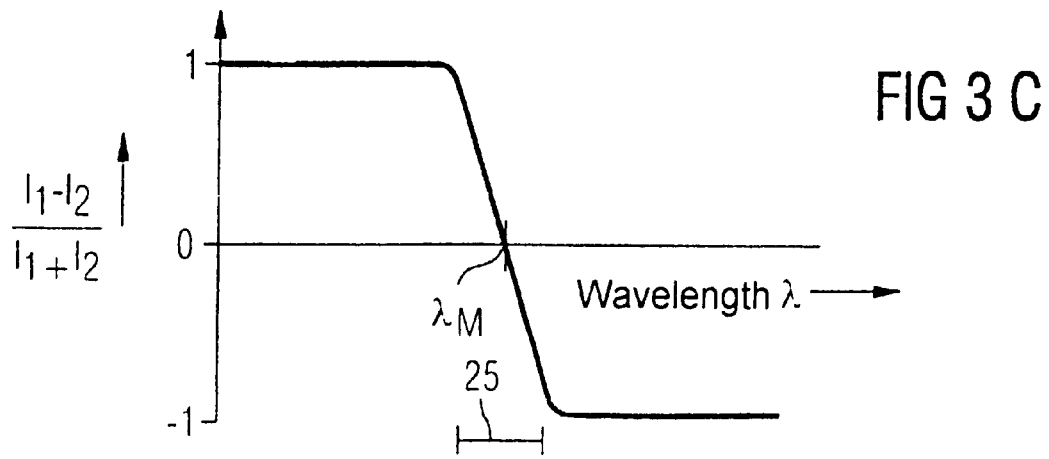

FIG. 3a illustrates a wavelength-dependent transmission of an optical high-pass filter (filter curve 20) and of an optical low-pass filter (filter curve 21), as may be used as the filter 14, for example. The filter slopes should be as steep as possible for a high spectral resolution. However, it is necessary to take account of the fact that a high slope gradient reduces a capture range 22 of the regulation.

The center wavelength $\lambda_M$ of a filter is determined by the condition "Transmission $(\lambda_M)$=50%". The center wavelengths of the filters illustrated in FIG. 3a are identical. Use is preferably made of a filter which can be operated in the vicinity of its center wavelength $\lambda_M$ with regard to the desired wavelength $\lambda_0$ (i.e. $\lambda_M >> \lambda_0$), since an operating point with a maximum gradient of the filter curve 20; 21 and also a symmetrical capture range 22 are obtained in this way.

It is also possible to use a further wavelength-selective filter 17 for regulating wavelength. Such a filter is illustrated in a dash-dotted manner in the beam path of the first partial beam 10 in FIG. 1. The first detector signal I1 is also wavelength-dependent in this case, i.e. $I_1(\lambda)$.

The two filters 14, 17 preferably have filter curves that are as far as possible in opposite directions (complementary) with regard to the desired wavelength $\lambda_0$. FIG. 3b illustrates suitable filter curves for the filter 14 and the filter 17. If bandpass filters are used, one of the filters 14; 17 may have a filter curve 23 and the other filter 17; 14 a filter curve 24. The two bandpass filters are preferably operated in the region of their center wavelengths $\lambda_M$, which—as illustrated here—should expediently be identical. If cut-off filters are used, it is possible to choose filters in accordance with the dash-dotted filter curves 20' (high-pass filter) and 21' (low-pass filter) which correspond to the filter curves 20, 21 illustrated in FIG. 3a. It is likewise possible to combine a cut-off filter with a bandpass filter.

If two filters 14, 17 are used, the actual value signal ACTUAL($\lambda$) which is independent of the laser power can be determined for example using the following relationship ACTUAL($\lambda$)=$(I_1(\lambda)-I_2(\lambda))/(I_1(\lambda)+I_2(\lambda))$ FIG. 3c shows the functional profile of ACTUAL($\lambda$) taking the filter curves 20 and 21 as a basis, that is to say two cut-off filters (high-pass and low-pass filter) having identical center wavelengths $\lambda_M$. Given an identical filter gradient, the wavelength sensitivity achieved is twice as large as that achieved when just one filter 14 is used. Furthermore, zero regulation is possible for the case $\lambda_M=\lambda_0$.

The filter 14 and also the optional filter 17 are preferably disposed in a manner that allows them to pivot. This enables targeted setting of the center wavelength $\lambda_M$ by tilting the respective filter 14, 17 relative to the beam axis of the first and second partial beam 10, 11, respectively. As a result, the configuration according to the invention can be used for a wide range of desired wavelengths $\lambda_0$ without changing filters, the tolerance requirements made of the filters 14, 17 with regard to adhering to a center wavelength $\lambda_M$ can be kept on a reasonable scale, and it is possible to carry out trimming of the center wavelength $\lambda_M$ to the desired wavelength $\lambda_0$ and, if two filters 14, 17 are used, trimming of the center wavelengths of the two filters 14, 17 with respect to one another.

In addition to the coupling-out of the partial beams 10, 11, the optical isolator 5 differs from the optical isolator 5' illustrated in FIG. 2 in that a permanently magnetized material is preferably used for the Faraday rotator 7, as a result of which an external magnet (for instance the solenoid 9') generating an external magnetic field B can be obviated.

This substantially facilitates the lateral beam coupling-out—according to the invention—at the polarizers 6, 8.

There are a large number of possible modifications of the exemplary embodiment illustrated in FIG. 1. By way of example, the first partial beam 10 does not have to be coupled out of the laser light pencil 2 at the first polarizer 6, but rather, in an alternative manner, may also be coupled out of the second partial beam 11 prior to passing through the filter 14 or at a reflection layer of the same. If the semiconductor laser 1 is an edge emitter, it is furthermore possible to utilize a laser beam as the first partial beam 11 which laser beam is emitted at an edge of the semiconductor laser 1 which is opposite to the edge that emits the laser light pencil 2.

Figure 4:
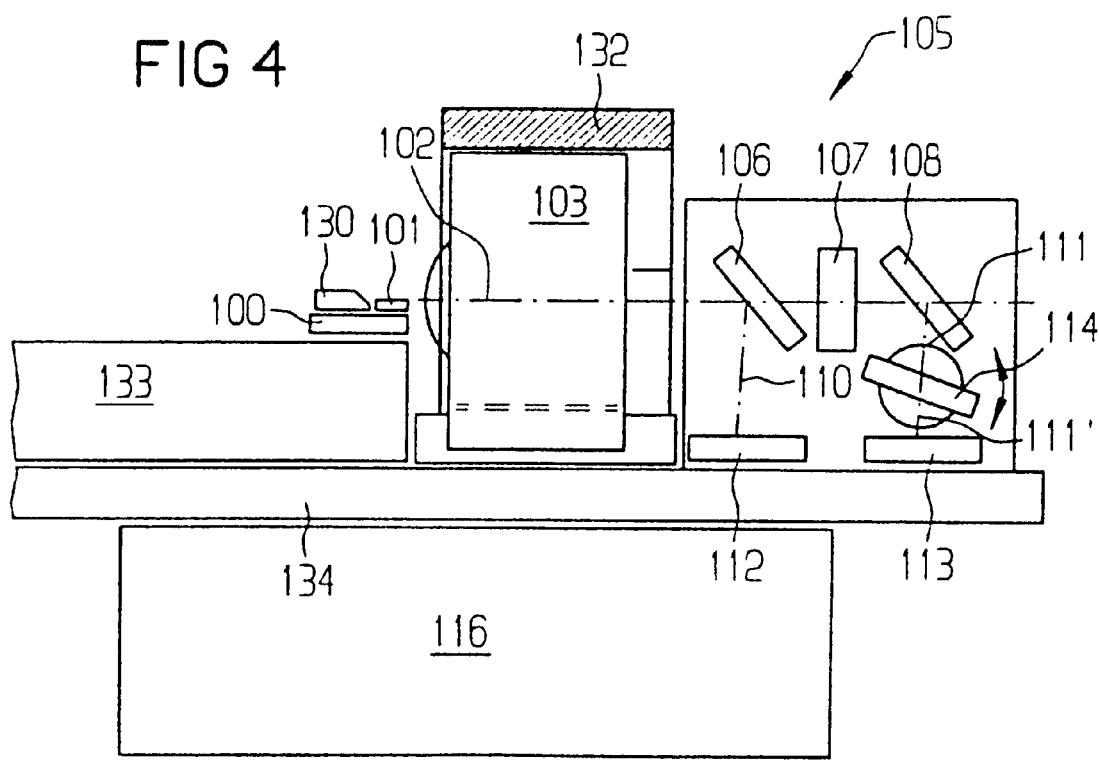
FIG. 4 is a side-elevational view of a first variant of the exemplary embodiment illustrated in FIG. 1.

FIG. 4 shows a first practical embodiment variant of the exemplary embodiment illustrated in FIG. 1.

A laser chip 101 is disposed on a silicon support 100. The support 100, which is also referred to as silicon submount, also has a deflection prism 130 mounted on it, by which prism 130 a further laser light pencil emerging at a rear edge of the laser chip 101 can be deflected and coupled out.

The laser light pencil 102 emitted by the laser chip 101 passes through a, for example, aspherical lens 103, which is supported in an adjustable manner in a lens mount 132, and passes into an optical isolator 105. The optical isolator 105 contains, in the manner already described, a first polarizer 106, a Faraday rotator 107 and a second polarizer 108. The polarizers 106, 108 are disposed at an inclination relative to the beam axis of the laser light pencil 102 in order to couple out first and second partial beams 110, 111. The second partial beam 111 passes through an optical filter 114 disposed in a manner allowing it to pivot. The reference symbols 112 and 113 designate first and second optical detectors which, as in FIG. 1, receive a first and a filtered second partial beam 110 and 111', respectively.

The silicon support 100 is fitted on an AlN baseplate 133, for example, and is in good thermal contact with the latter. The baseplate 133, the lens mount 132 and the optical isolator 105 are jointly mounted on a plate 134. The plate 134 may be composed of silicon or AlN and is fitted on a cooling area of a Peltier element 116, with good heat transfer being formed. The temperature of the Peltier element 116 is regulated in the manner already described in order to stabilize the laser wavelength $\lambda$. As a result of the structure illustrated, good temperature stability is also obtained at the lens 103, at the optical isolator 105 and at the filter 114.

In order to adjust the center wavelength $\lambda_M$, the tilt angle of the filter 114 with regard to the beam axis of the second partial beam 111 is altered by pivoting the filter 114. The filter 114 is then fixed in the adjustment position found by welding, soldering or bonding.

Figure 5:
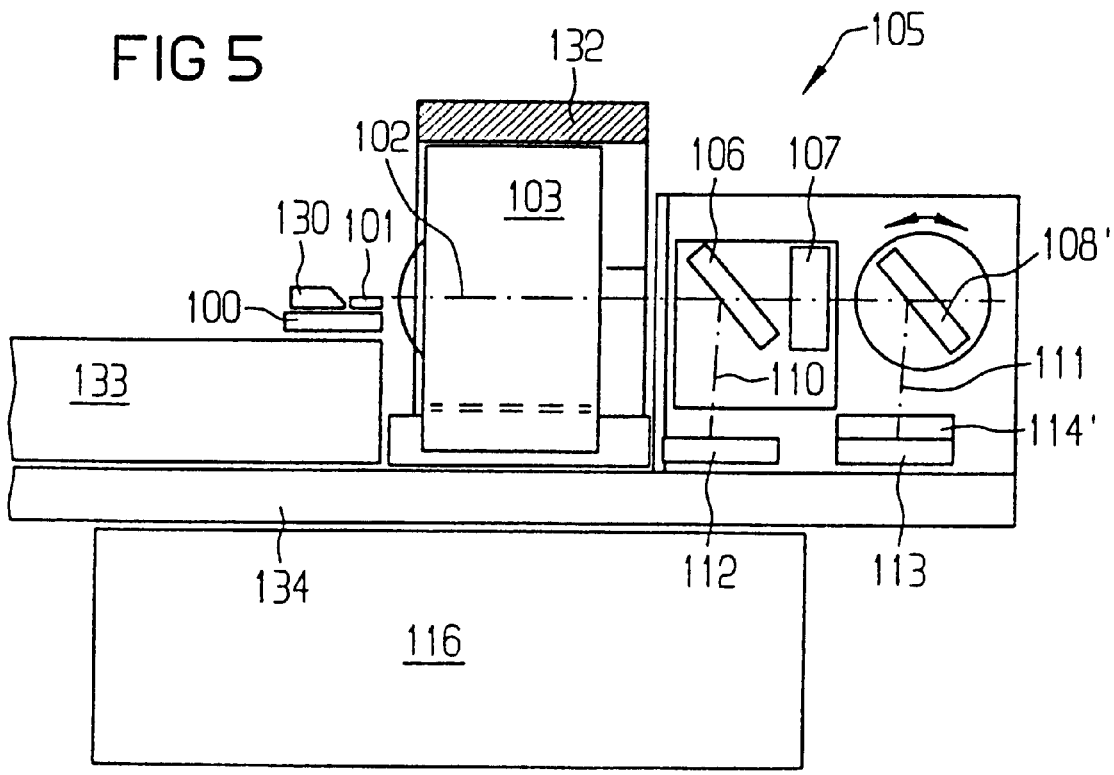
FIG. 5 is a side-elevational view of a second variant of the exemplary embodiment illustrated in FIG. 1.

FIG. 5 shows a second embodiment variant of the invention. Parts identical to those in FIG. 4 are identified by the same reference symbols. The embodiment variant shown in FIG. 5 differs from the variant illustrated in FIG. 4 essentially only in that instead of varying the tilt angle of the filter 114, in this case the tilt angle of the second polarizer 108' can be varied for adjustment purposes. For this purpose, the second polarizer 108' is fitted to a rotatably mounted, lockable spindle, while the filter 114' is fixed in position. It can be fixed directly on the entry window of the second detector 113, for example.

Figure 6:
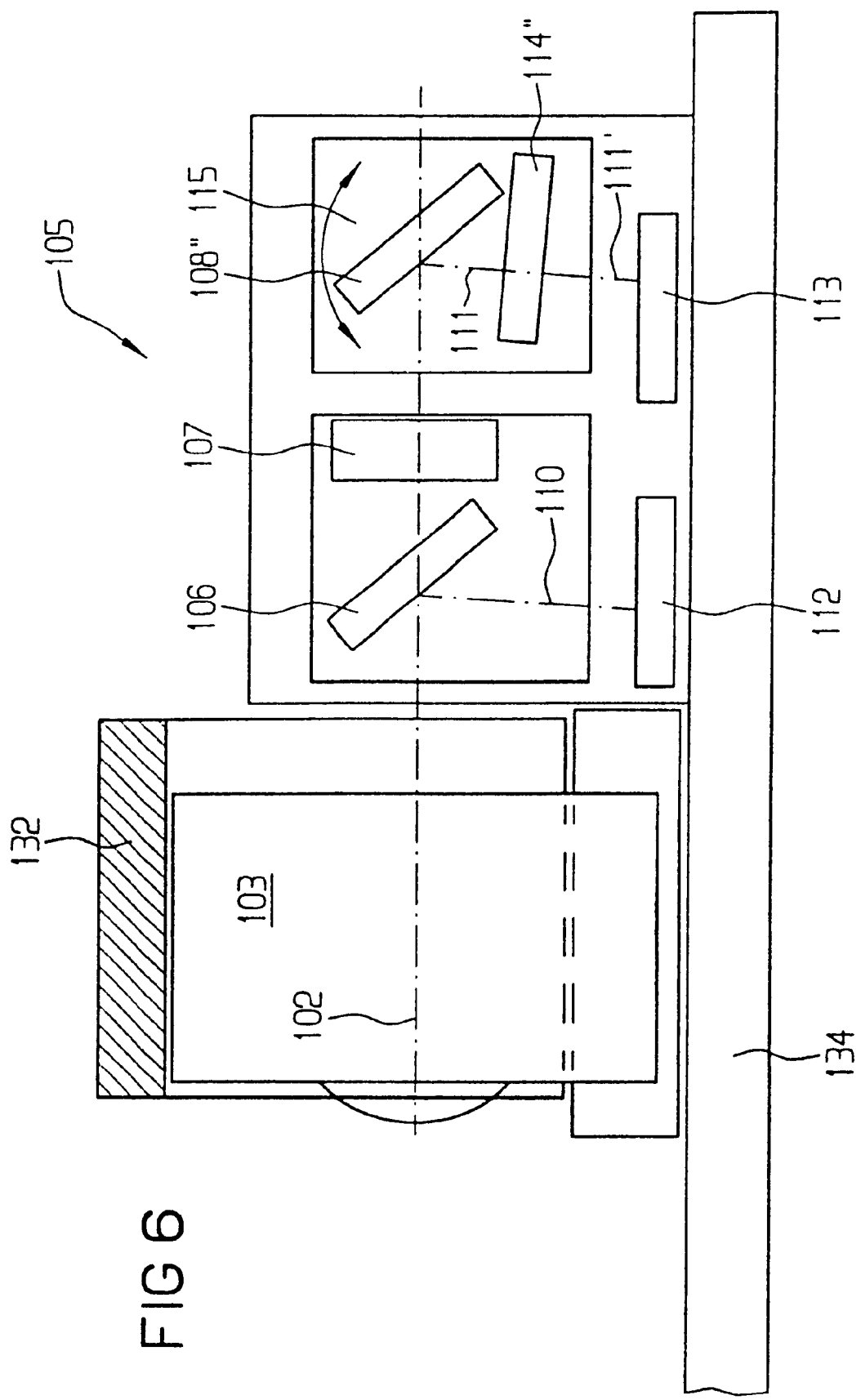
FIG. 6 is a side-elevational view of a third variant of the exemplary embodiment illustrated in FIG. 1.

FIG. 6 shows a third embodiment variant of the invention, parts identical to those in FIGS. 4 and 5 being identified by the same reference symbols in this case as well. The embodiment variant shown in FIG. 6 differs from the variants in FIGS. 4 and 5 essentially in that in this case a unit 115 containing a second polarizer 108" and a filter 114" is disposed in a manner allowing it to be tilt-adjusted, a fixed relative position between the second polarizer 108" and the filter 114" being provided.

Figure 7A:
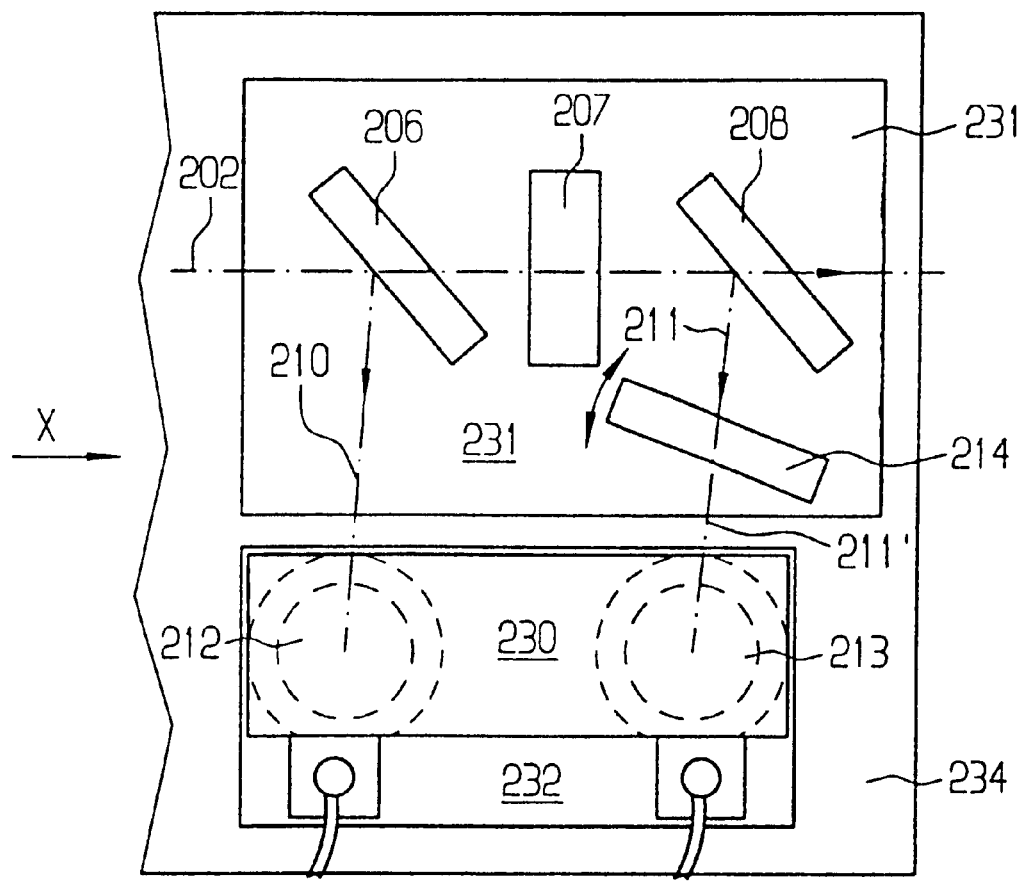
FIG. 7a is a plan view of a fourth embodiment variant of the exemplary embodiment illustrated in FIG. 1.

FIG. 7a shows, in plan view, a partial illustration of a fourth embodiment variant of the exemplary embodiment illustrated in FIG. 1. By comparison with the embodiment variants illustrated in FIGS. 4 to 6, in this case the configuration containing first and second polarizers 206 and 208, Faraday rotator 207, filter 214 and first and second detector 212 and 213 is tilted by 90°. A laser light pencil 202 and coupled-out partial beams 210, 211, 211' consequently run in a plane parallel to a baseplate 234, which corresponds to the plate 134 in FIGS. 4 to 6 and carries the laser chip, in a manner that is not illustrated. The filter 214 can be pivoted about a spindle perpendicularly to the baseplate 234, while the second polarizer 208 is fixed in position. With regard to the adjustment conditions, the configuration thus corresponds to the first embodiment variant shown in FIG. 4. In an analogous manner, the adjustment possibilities (pivotable second polarizer 208 and pivotable unit containing the second polarizer 208 and the filter 214) explained with reference to FIGS. 5 and 6 can also be realized in the case of the tilted fourth embodiment variant.

Figure 7B:
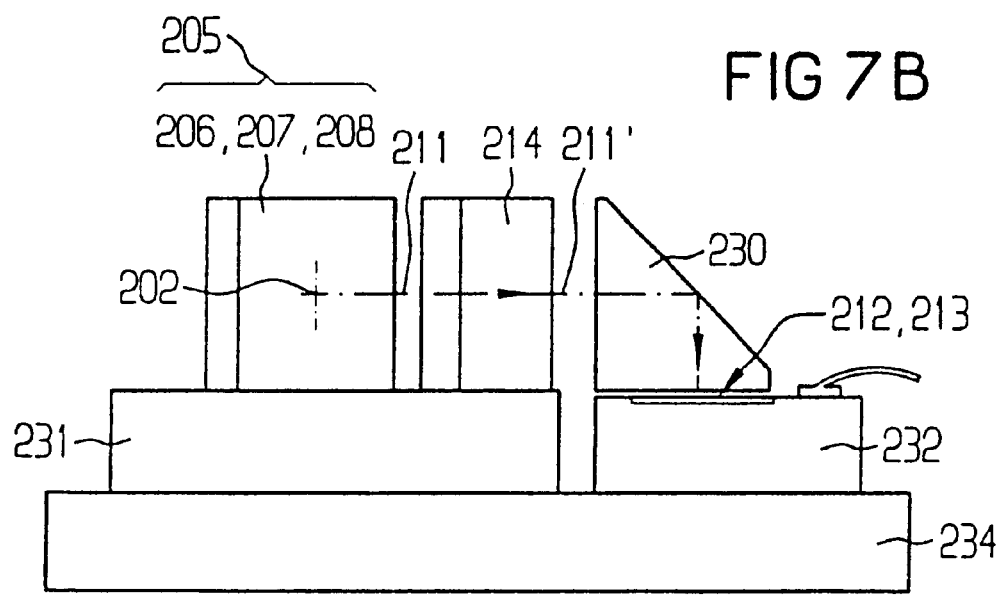

FIG. 7b shows a side view of the fourth embodiment variant from the direction of the arrow X in FIG. 7a. The optical isolator 205 and the filter 214 are fitted on a common, first intermediate support 231, while the detectors 212, 213 are provided on an adjacent detector support 232. Situated above the detector support 232 is a deflection prism 230, which deflects the two partial beams 210 and 211' onto the respective detectors 212, 213. The angle of deflection is expediently chosen to be somewhat different from 90°, in order that the light reflected from the detectors 212, 213 does not impinge back on the laser chip.

The fourth embodiment variant of the invention as shown in FIGS. 7a, 7b is favorable particularly when it is required that the laser configuration have a small structural height (level above the baseplate 234).

On account of their small space requirement, the structures shown in FIGS. 4 to 7b can be accommodated in a simple manner in a hermetically sealed module housing (not illustrated). In this case, the signal processing device 15a, the comparison device 15b and the drive device 15c may be disposed outside or else inside the module housing.

I claim:
1. A wavelength-stabilized laser configuration, comprising:

a semiconductor laser outputting a laser beam having a laser power, a laser beam path, and a laser light;

a regulating device, including:
   a first optical detector receiving a first partial beam derived from said laser beam and outputting a first optical detector output signal;
   an optical filter;
   a second optical detector disposed downstream of said optical filter and receiving a second partial beam derived from said laser beam and filtered by said optical filter, said second optical detector outputting a second optical detector output signal;
   a signal processing device receiving the first optical detector output signal and the second optical detector output signal and determining from the first optical detector output signal and the second optical detector output signal an actual value signal being representative of an instantaneous laser wavelength $\lambda$ being independent of the laser power;
   a comparison device connected to said signal processing device for comparing the actual value signal with a predetermined desired value signal specifying a desired wavelength $\lambda_0$; and
   a drive device connected to said comparison device, said drive device generating a control signal setting an operating parameter of said semiconductor laser, said operating parameter influencing a wavelength to be stabilized such that the actual value signal substantially corresponds to the predetermined desired value signal; and an optical isolator disposed in said laser beam path and having a first polarizer, a device for rotating a plane of polarization of said laser light and connected downstream of said first polarizer, and a second polarizer connected downstream of said device for rotating the plane of polarization of the laser light, at least one of said first polarizer and said second polarizer being used as a beam splitter for coupling out one of said first partial beam and said second partial beam.

2. The wavelength-stabilized laser configuration according to claim 1, wherein said second polarizer is used as a beam splitter for coupling out the second partial beam from said laser beam.

3. The wavelength-stabilized laser configuration according to claim 1, wherein said first polarizer is used as a beam splitter for coupling out the first partial beam from said laser beam.

4. The wavelength-stabilized laser configuration according to claim 1, wherein said at least one of said first polarizer and said second polarizer used as said beam splitter is a partly reflective polarization filter disposed at an inclination relative to an incident laser beam.

5. The wavelength-stabilized laser configuration according to claim 1, wherein said optical filter is a filter selected from the group consisting of cut-off filters and bandpass filters.

6. The wavelength-stabilized laser configuration according to claim 2, including a further filter filtering the first partial beam received by said first optical detector.

7. The wavelength-stabilized laser configuration according to claim 6, including a $\lambda/2$ plate disposed in said laser beam path of the first partial beam between said first polarizer and said further filter.

8. The wavelength-stabilized laser configuration according to claim 6, wherein said further filter is selected from the group consisting of cut-off filters and bandpass filters.

9. The wavelength-stabilized laser configuration according to claim 6, wherein said optical filter and said further filter are one of an interference filter and an etalon.

10. The wavelength-stabilized laser configuration according to claim 6, wherein said optical filter has a filter curve and said further filter has a filter curve shifted relative to said filter curve of said optical filter and in an opposite direction with regard to the desired wavelength $\lambda_0$.

11. The wavelength-stabilized laser configuration according to claim 10, wherein said filter curve of said optical filter and said filter curve of said further filter have a point of intersection at the desired wavelength $\lambda_0$.

12. The wavelength-stabilized laser configuration according to claim 1, wherein at least one of said optical filter and said further filter are disposed in a manner that allows said at least one of said optical filter and said further filter to pivot.

13. The wavelength-stabilized laser configuration according to claim 1, wherein at least one of said second polarizer and said first polarizer is disposed in a manner that allows said at least one of said second polarizer and said first polarizer to pivot.

14. The wavelength-stabilized laser configuration according to claim 2, including a common, pivotable unit and said second polarizer and said optical filter are disposed in a mutually positionally fixed relationship in said common, pivotable unit.

15. The wavelength-stabilized laser configuration according to claim 1, including an optical coupling unit having a lens carrier carrying a coupling lens for coupling out said laser beam emitted by said semiconductor laser, and said lens carrier can be deformed in a targeted and permanent manner by being exposed to a further laser beam from an external adjustment laser.

16. The wavelength-stabilized laser configuration according to claim 1, wherein said device for rotating the plane of polarization is a Faraday rotator.

17. The wavelength-stabilized laser configuration according to claim 16, wherein said Faraday rotator is permanently magnetized.

18. The wavelength-stabilized laser configuration according to claim 1, wherein said first optical detector and said second optical detector are disposed in a tilted manner relative to the first partial beam and the second partial beam respectively such that a partial beam reflection occurring at said first optical detector and said second optical detector is reflected out of the first partial beam and the second partial beam.

19. The wavelength-stabilized laser configuration according to claim 1, including a cooling device, said semiconductor laser in thermal contact with said cooling device and a temperature of said semiconductor laser is set as a wavelength-selective operating parameter by sa d cooling device.

20. The wavelength-stabilized laser configuration according to claim 19, wherein at least one of said optical isolator and said optical filter is in thermal contact with said cooling device.

21. A laser module, comprising:
   a wavelength-stabilized laser configuration, containing:
      a semiconductor laser outputting a laser beam having a laser power, a laser beam path, and a laser light;
      a regulating device, including:
         a first optical detector receiving a first partial beam derived from said laser beam and outputting a first optical detector output signal;
         an optical filter;
         a second optical detector disposed downstream of said optical filter and receiving a second partial beam derived from said laser beam and filtered by said optical filter, said second optical detector outputting a second optical detector output signal;

a signal processing device receiving the first optical detector output signal and the second optical detector output signal and determines from the first optical detector output signal and the second optical detector output signal an actual value signal being representative of an instantaneous laser wavelength $\lambda$ and independent of the laser power;

a comparison device connected to said signal processing device for comparing the actual value signal with a predetermined desired value signal specifying a desired wavelength $\lambda_0$; and a drive device connected to said comparison device, said drive device generating a control signal setting an operating parameter of said semiconductor laser, said operating parameter influencing a wavelength to be stabilized such that the actual value signal substantially corresponds to the desired value signal;

an optical isolator disposed in said laser beam path and having a first polarizer, a device for rotating a plane of polarization of said laser light and connected downstream of said first polarizer, and a second polarizer connected downstream of said device for rotating the plane of polarization of the laser light, at least one of said first polarizer and said second polarizer being used as a beam splitter for coupling out one of said first partial beam and said second partial beam;

a hermetically sealed module housing accommodating said semiconductor laser, said optical isolator, said first optical detector, said second optical detector and said optical filter of said regulating device; and a device for coupling an optical fiber and being provided outside of said hermetically sealed module housing.

22. A wavelength-stabilized laser configuration, comprising:

a semiconductor laser outputting a laser beam having a laser power, a laser beam path, and a laser light;

a regulating device, including:

a first optical detector receiving a first partial beam derived from said laser beam and outputting a first optical detector output signal;

an optical filter positioned behind a beam splitter;

a second optical detector disposed downstream of said optical filter and receiving a second partial beam derived from said laser beam and filtered by said optical filter, said second optical detector outputting a second optical detector output signal;

a signal processing device receiving the first optical detector output signal and the second optical detector output signal and determining from the first optical detector output signal and the second optical detector output signal an actual value signal being representative of an instantaneous laser wavelength k being independent of the laser power;

a comparison device connected to said signal processing device for comparing the actual value signal with a predetermined desired value signal specifying a desired wavelength $\lambda_0$; and a drive device connected to said comparison device, said drive device generating a control signal setting an operating parameter of said semiconductor laser, said operating parameter influencing a wavelength to be stabilized such that the actual value signal substantially corresponds to the predetermined desired value signal; and an optical isolator disposed in said laser beam path and having a first polarizer, a device for rotating a plane of polarization of said laser light and connected downstream of said first polarizer, and a second polarizer connected downstream of said device for rotating the plane of polarization of the laser light, at least one of said first polarizer and said second polarizer being used as said beam splitter for coupling out one of said first partial beam and said second partial beam.

* * * * *